United States Patent
Meyer-Berg et al.

(10) Patent No.: US 9,269,685 B2
(45) Date of Patent: Feb. 23, 2016

(54) INTEGRATED CIRCUIT PACKAGE AND PACKAGING METHODS

(75) Inventors: Georg Meyer-Berg, Munich (DE); Frank Daeche, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 124 days.

(21) Appl. No.: 13/103,124

(22) Filed: May 9, 2011

(65) Prior Publication Data

US 2012/0286413 A1 Nov. 15, 2012

(51) Int. Cl.
*H01L 25/00* (2006.01)
*H01L 23/00* (2006.01)
*H01L 23/31* (2006.01)
*H01L 23/13* (2006.01)
*H01L 23/498* (2006.01)
*H01L 25/065* (2006.01)
*H01L 25/18* (2006.01)
*H01L 23/36* (2006.01)

(52) U.S. Cl.
CPC .............. *H01L 24/18* (2013.01); *H01L 23/13* (2013.01); *H01L 23/3128* (2013.01); *H01L 23/36* (2013.01); *H01L 23/49822* (2013.01); *H01L 23/49827* (2013.01); *H01L 24/05* (2013.01); *H01L 24/06* (2013.01); *H01L 24/32* (2013.01); *H01L 25/0655* (2013.01); *H01L 25/18* (2013.01); *H01L 2224/0557* (2013.01); *H01L 2224/06181* (2013.01); *H01L 2224/32245* (2013.01); *H01L 2924/00014* (2013.01); *H01L 2924/01322* (2013.01); *H01L 2924/1305* (2013.01); *H01L 2924/13055* (2013.01); *H01L 2924/14* (2013.01); *H01L 2924/1431* (2013.01); *H01L 2924/15153* (2013.01); *H01L 2924/15311* (2013.01)

(58) Field of Classification Search
CPC ......... H01L 24/26; H01L 24/30; H01L 24/33; H01L 24/01; H01L 24/80
See application file for complete search history.

(56) References Cited

U.S. PATENT DOCUMENTS

| 4,477,828 A | 10/1984 | Scherer |
| 6,075,712 A | 6/2000 | McMahon |
| 6,350,954 B1 | 2/2002 | Specks et al. |
| 7,323,766 B2 | 1/2008 | Weiblen et al. |
| 8,536,691 B2 | 9/2013 | Kikuchi et al. |
| 2001/0001989 A1* | 5/2001 | Smith .......................... 174/52.1 |
| 2005/0101161 A1 | 5/2005 | Weiblen et al. |
| 2005/0127489 A1* | 6/2005 | Mallik et al. .................. 257/686 |
| 2007/0025092 A1 | 2/2007 | Lee et al. |
| 2007/0085201 A1 | 4/2007 | Bauer et al. |
| 2008/0116564 A1 | 5/2008 | Yang et al. |
| 2008/0186690 A1 | 8/2008 | Miettinen et al. |

(Continued)

FOREIGN PATENT DOCUMENTS

| CN | 101536181 A | 9/2009 |
| CN | 102779808 A | 11/2012 |

(Continued)

*Primary Examiner* — Jae Lee

(57) ABSTRACT

An integrated circuit package includes a package module formed from successive build-up layers which define circuit interconnections, a cavity formed on a top-side of the package module, a chip having a front side with forward contacts and having a back-side, the chip disposed such that in the cavity such that at least one forward contact is electrically connected to at least one of the circuit interconnections of the package module, and a top layer coupled to the back-side of the chip covering at least a part of the chip and the top-side of the package module.

24 Claims, 6 Drawing Sheets

(56) References Cited

U.S. PATENT DOCUMENTS

| | | |
|---|---|---|
| 2008/0205008 A1 | 8/2008 | Sun et al. |
| 2009/0020882 A1 | 1/2009 | Hasegawa |
| 2009/0283895 A1 | 11/2009 | Kikuchi et al. |
| 2010/0081236 A1 | 4/2010 | Yang et al. |
| 2010/0123241 A1* | 5/2010 | Shi et al. ............ 257/698 |
| 2010/0140779 A1* | 6/2010 | Lin et al. ............ 257/690 |
| 2010/0187676 A1 | 7/2010 | Suh et al. |
| 2011/0115060 A1 | 5/2011 | Chiu et al. |
| 2011/0260336 A1* | 10/2011 | Kang et al. ............ 257/777 |
| 2012/0146177 A1 | 6/2012 | Choi et al. |
| 2012/0286413 A1 | 11/2012 | Meyer-Berg et al. |

FOREIGN PATENT DOCUMENTS

| | | |
|---|---|---|
| DE | 10352002 A1 | 6/2005 |
| JP | 08335650 A | 12/1996 |
| JP | 2004087700 A | 3/2004 |

* cited by examiner

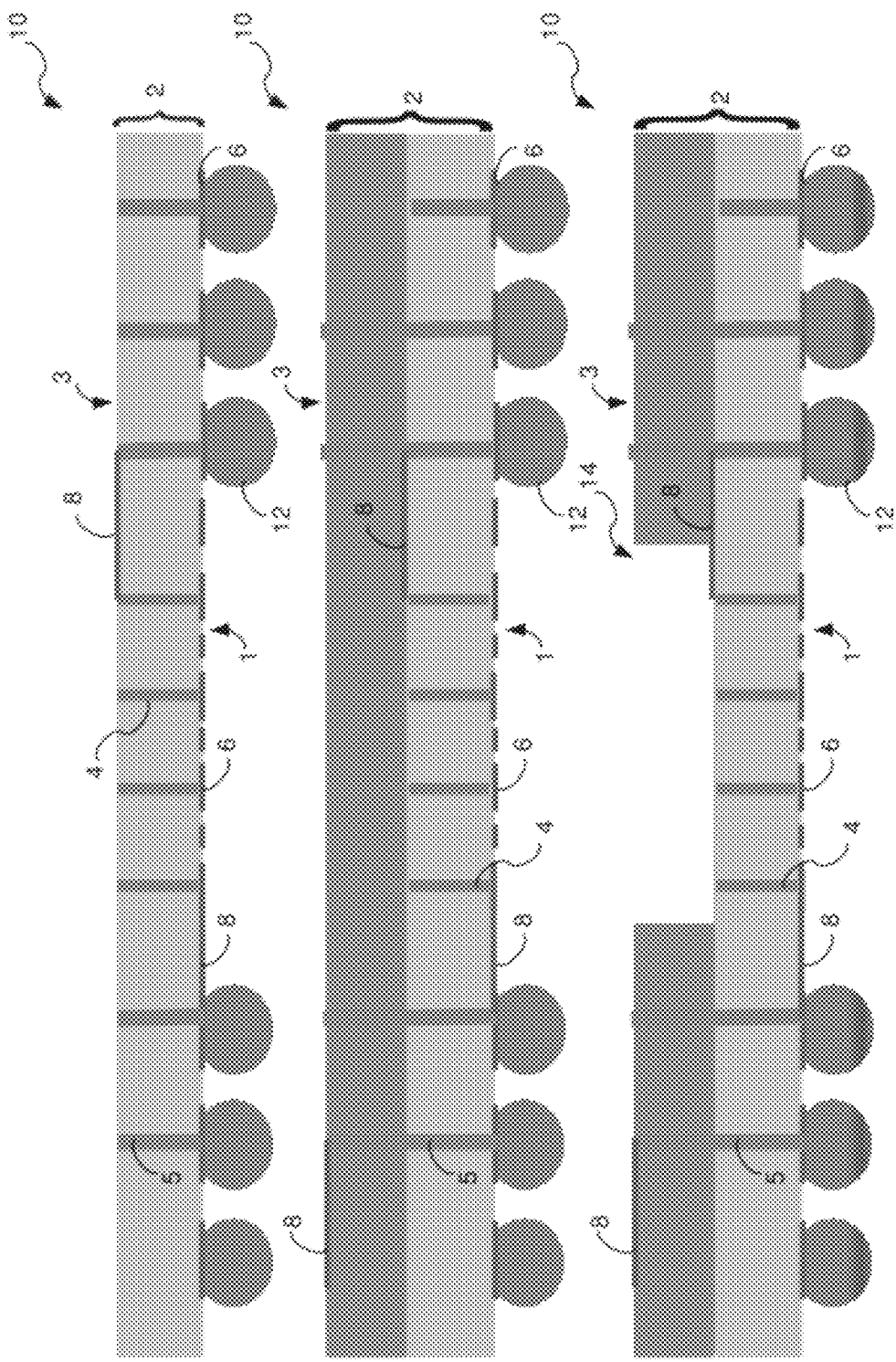

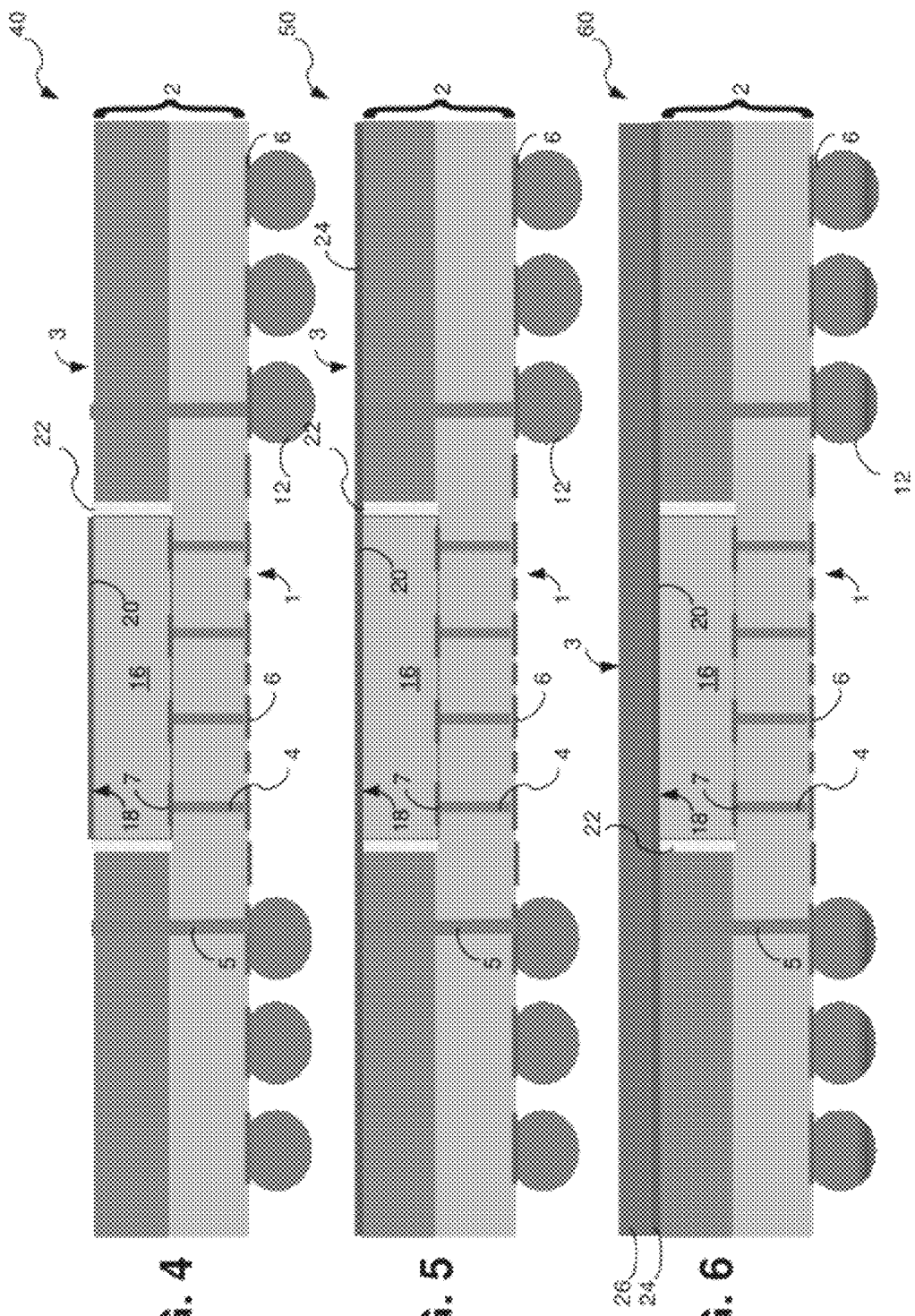

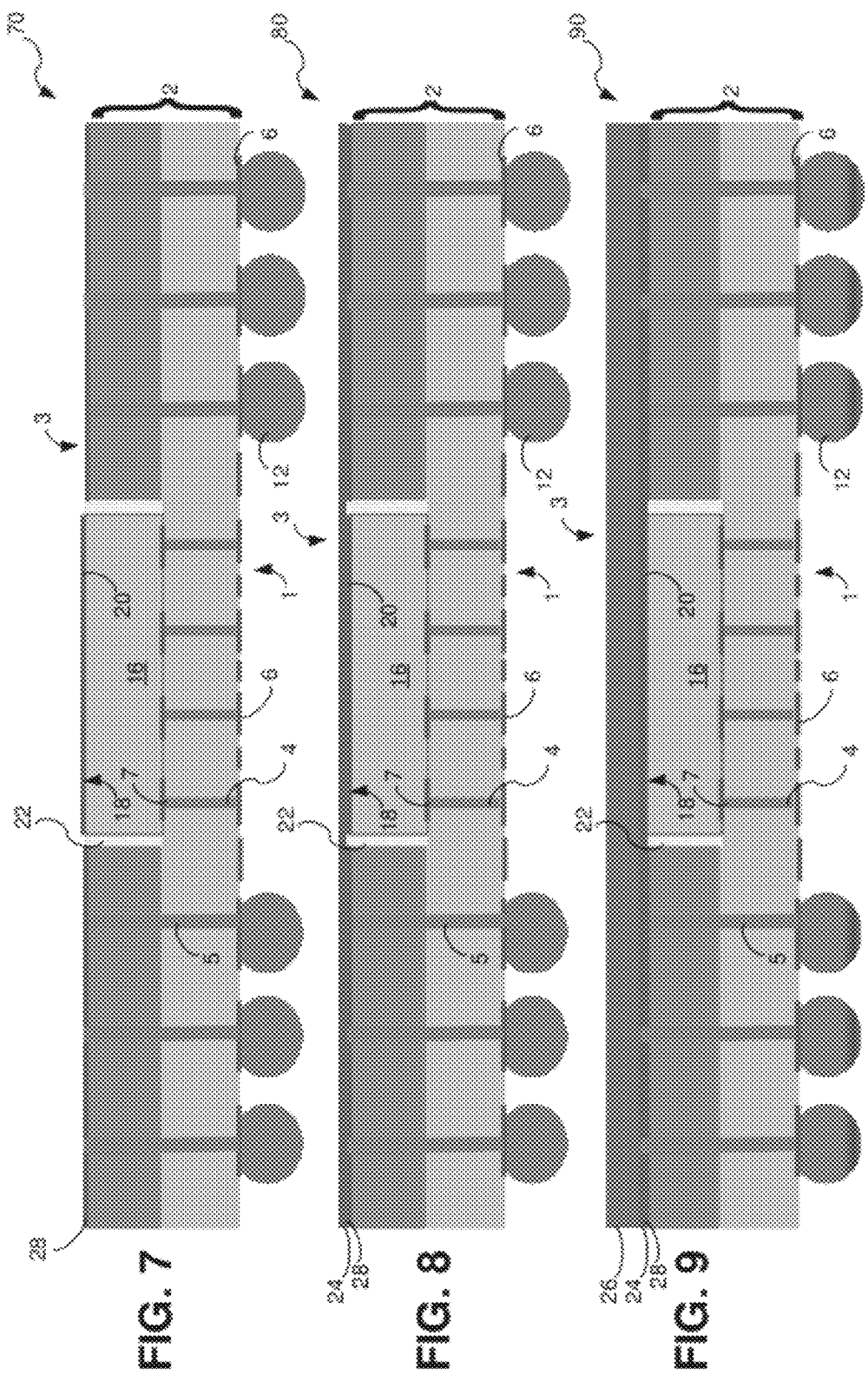

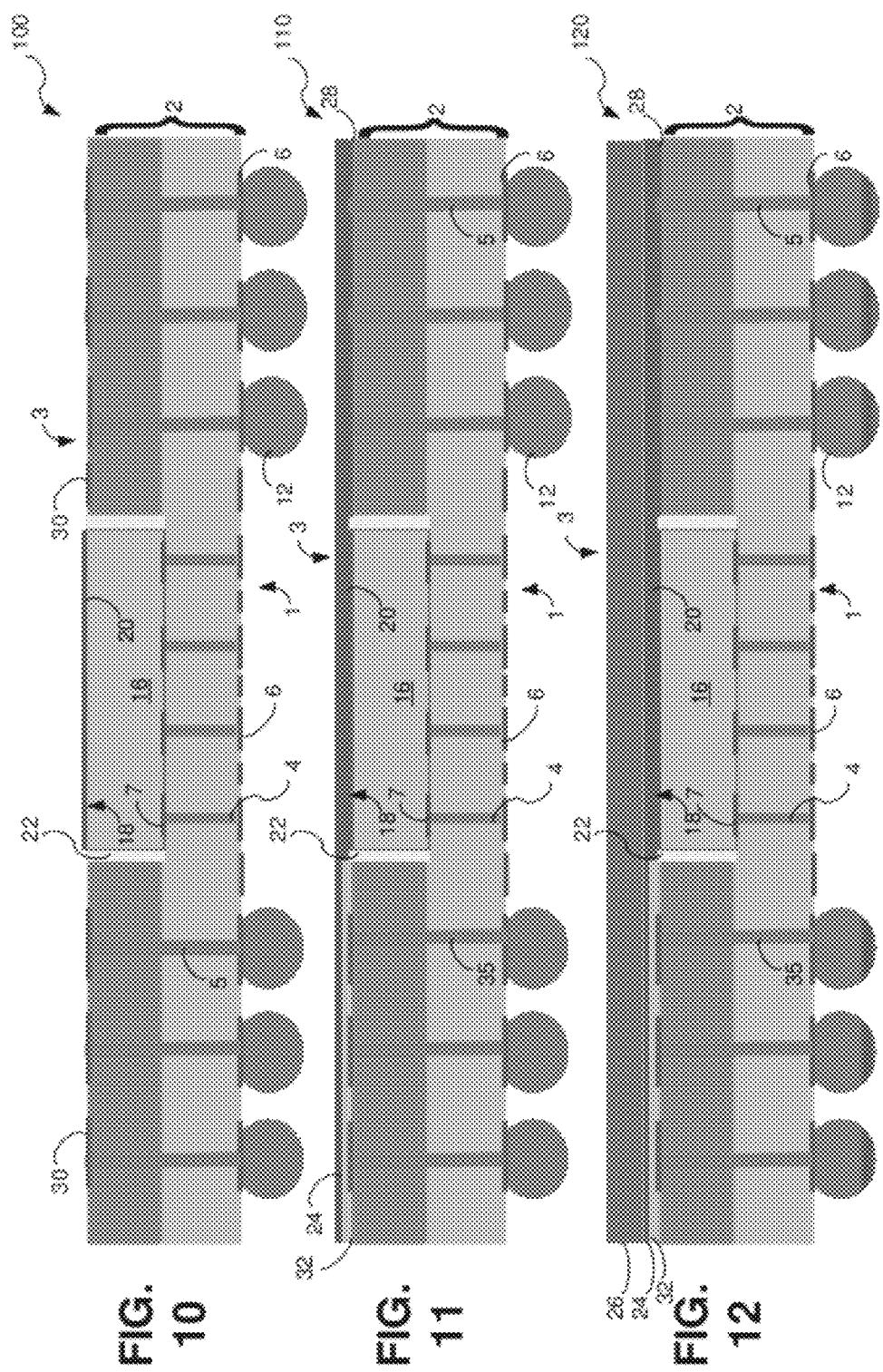

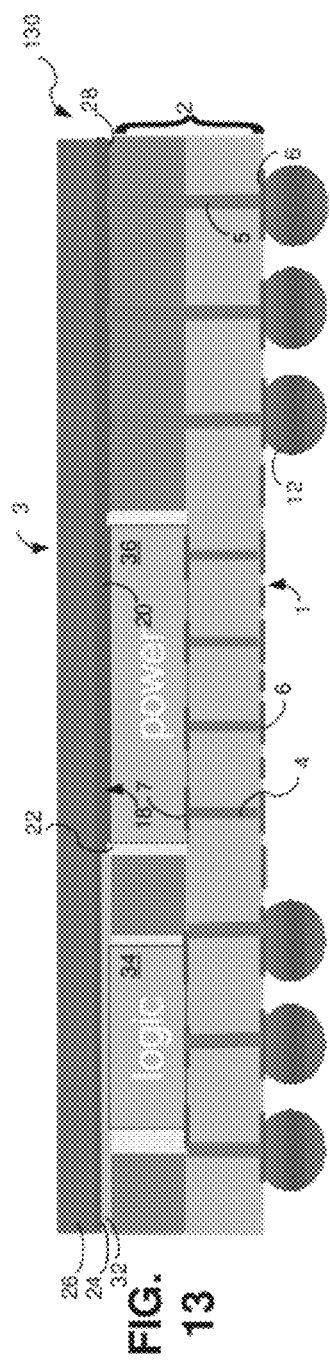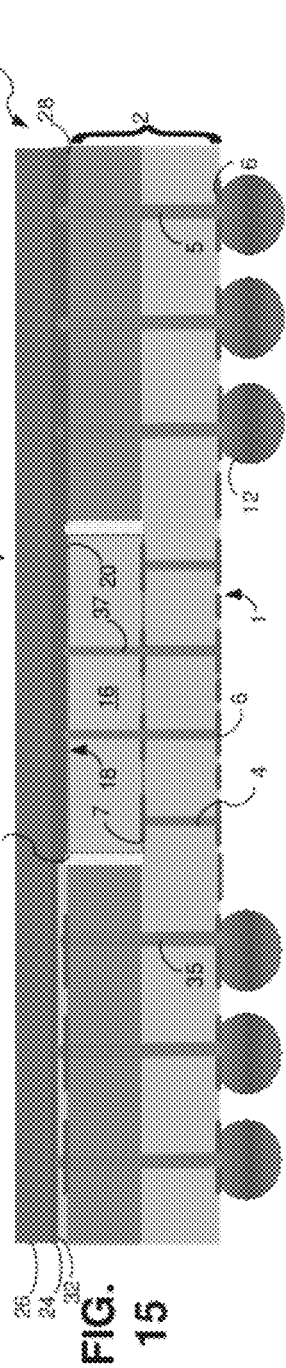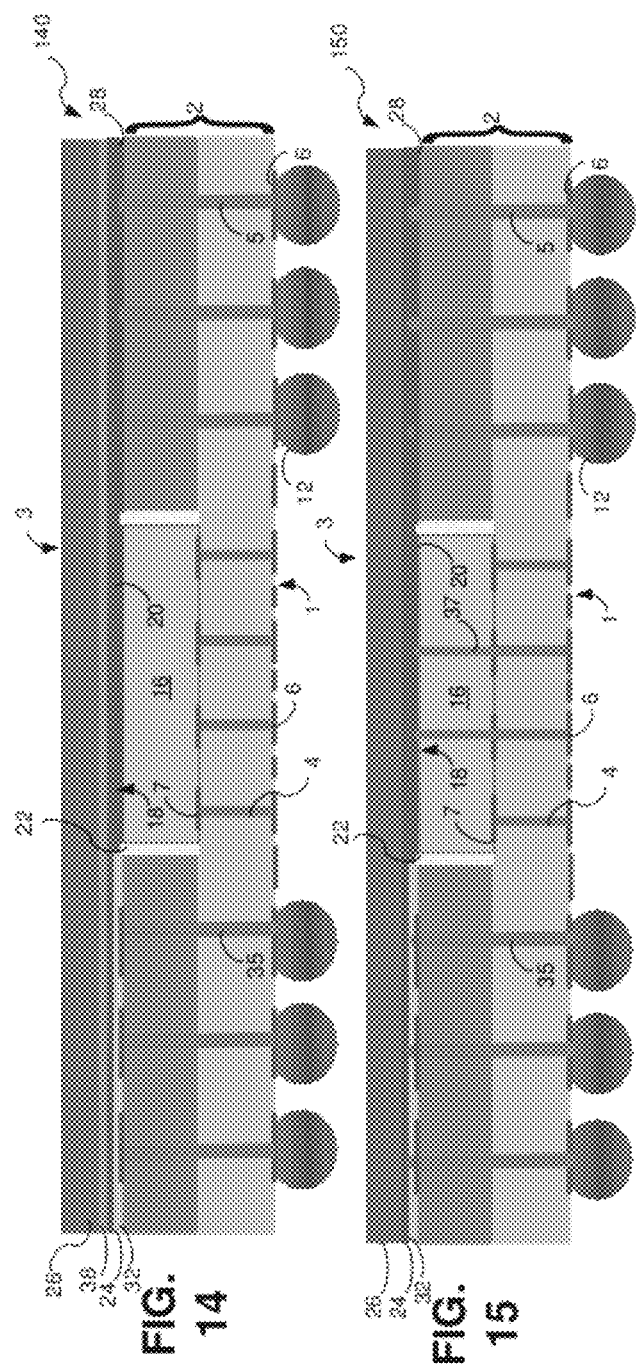
FIG. 13
FIG. 14
FIG. 15

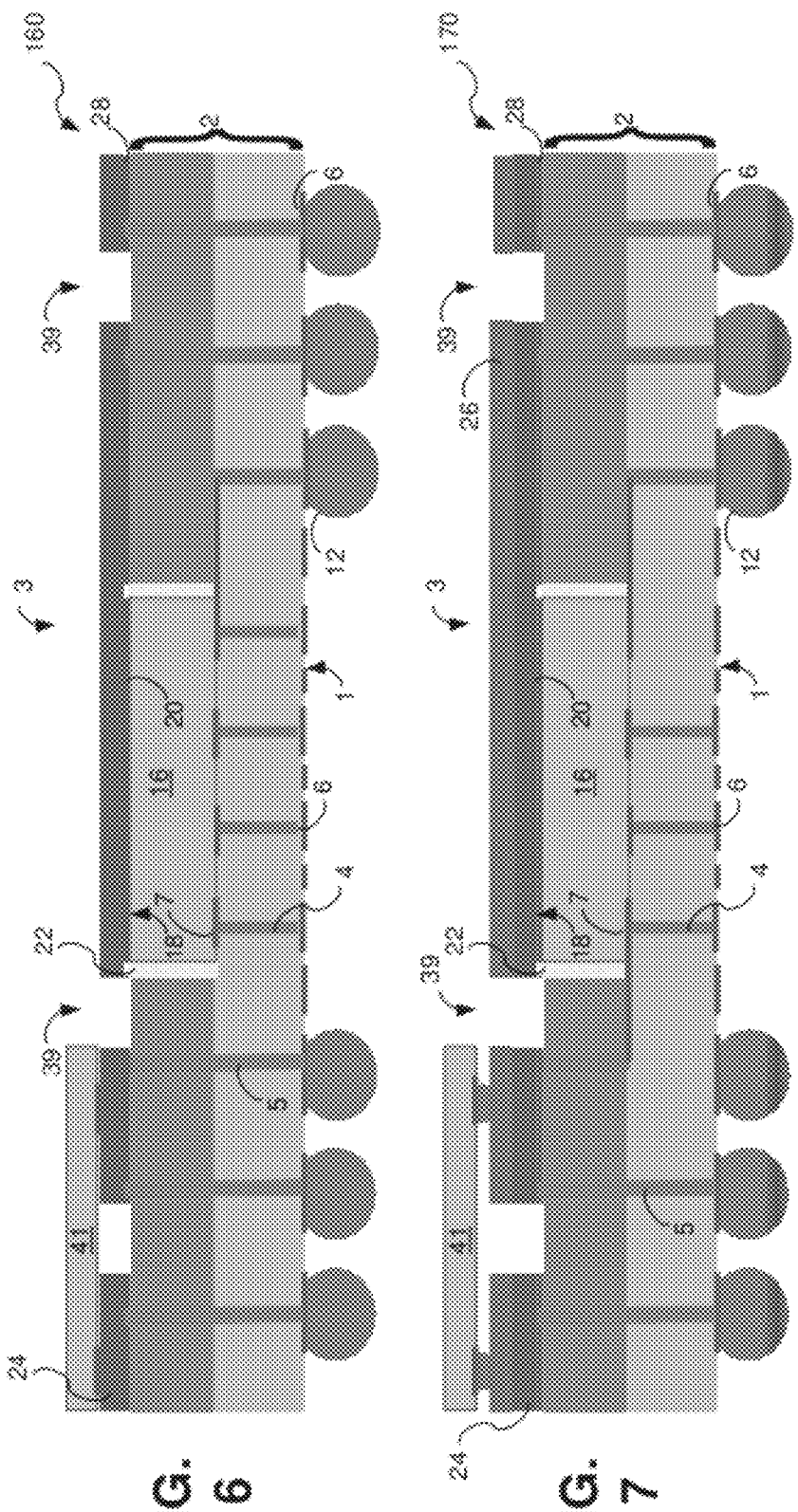

INTEGRATED CIRCUIT PACKAGE AND PACKAGING METHODS

FIELD OF THE DISCLOSURE

This disclosure relates to apparatus and methods for manufacturing circuits and, more particularly, to apparatus and methods for packaging integrated circuits.

BACKGROUND

Integrated circuit (IC) chips are usually incorporated into a package. Such packaging provides, for example, physical and environmental protection as well as heat dissipation. Moreover, packaged chips typically provide electrical leads to allow integration with further components.

Several IC packaging techniques have been developed. One such technique, for example is described in, Lee et al., "Embedded Actives and Discrete Passives in a Cavity Within Build-up Layers," U.S. patent application Ser. No. 11/494,259 filed on Jul. 27, 2006 and published as US 2007/0025092 A1 on Feb. 1, 2007, the content of which is hereby incorporated by reference in its entirety. Lee et al. discloses, inter alia, a so-called chip-last approach.

In contrast to a chip-first or chip-middle process, a chip-last approach embeds a given chip after all build-up layer processes are finished. The advantages of this approach are now well known, however, chip-last packaging is not thought to be appropriate for all chip types. For example, for ICs having a back side contact, and for those chips whose operating parameters call for dissipation of higher quantities of heat, such as power chips and high-performance logic chips.

SUMMARY

In a first implementation, in order to provide a package module appropriate for a wide range of chip types, including power chips, chips having a back-side contact, and high performance logic chips, an integrated circuit package includes a package module with a cavity formed therein. The package module may be formed as a laminate from successive build-up layers which define a top side, a bottom side and circuit interconnections therebetween. Following a chip-last approach, the cavity may be formed on the top-side of the package module. Typically, the formation of the cavity exposes one or more of the circuit interconnections, for example at the bottom of the cavity. A chip having for example a front side with a set of forward contacts and a back-side may be disposed in the cavity such that the set of forward contacts are electrically connected to one or more of the circuit interconnections of the package module. A top layer provided on the package module may be coupled to the back-side of the chip, and covers at least a part of the chip and the top-side of the package module.

Similarly, in another implementation, an integrated circuit packaging method includes fabricating a package module from successive build-up layers which define circuit interconnections, forming a cavity on a top-side of the package module, disposing a chip having a front side with a set of forward contacts and a back-side in the cavity such that the set of forward contacts are electrically connected to one or more of the circuit interconnections of the package module, and coupling a top layer to the back-side of the chip covering at least part of the chip and the top-side of the package module.

One or more of the following features may be included or combined in the above implementations. The back-side of the chip may be a low ohmic contact. Current may flow vertically between the low ohmic contact and the set of forward contacts of the chip. The chip may be a power electronics chip. The top layer may be a metallic layer. The low ohmic contact may be electrically connected, for example through electrical connection with the top layer, to one or more vias formed in the package module. The chip may be a high-performance logic chip. The top layer may have thermally conductive properties facilitating heat spreading. The top layer may be attached to a heat sink. The top layer may be formed by dirty plasma. The top layer may be a nano metal, plated metal, a sputtered metal, a structured metal, a metal foil, or a combination thereof. The top layer may be plated onto the back side of the chip and package module or coupled thereto by an adhesive. The top layer may be coupled to the back-side of the chip and the top-side of the package module by solder, for example to a metallic back-side contact of the chip and to the top surface of the package module following sputtering thereon. Alternatively, the top layer may be printed metal, such as by ink-jetting metal on the top-side surface of the package module and/or chip. Moreover, combinations of applications in a single package may be implemented, such as by solder to a metallic back-side contact of the chip and by adhesive to the top surface of the package. The implementation may further include a metal foil layer coupled onto the top layer by an adhesive means such as nano paste, glue, and solder. The chip may include through silicon vias. All or a portion of the top layer may be coupled to the back-side of the chip and the top-side of the package module by way of an isolating middle layer.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 1-3 show an exemplary process flow, from a cross-sectional view, for fabricating an exemplary package module;

FIG. 4 illustrates a cross-sectional view of an exemplary integrated circuit package with a chip having back-side contact;

FIG. 5 illustrates a cross-sectional view of an exemplary integrated circuit package with a top layer;

FIG. 6 illustrates a cross-sectional view of an exemplary integrated circuit package with a heat sink and/or metal foil layer;

FIGS. 7-9 illustrate cross-sectional views of exemplary integrated circuit packages as in FIGS. 4-6 with a top side package contact;

FIG. 10-12 illustrate cross-sectional views of exemplary integrated circuit packages as in FIGS. 4-6 with top side pads and/or isolating middle layers;

FIG. 13 illustrates a cross-sectional view of an exemplary integrated circuit package with multiple chips;

FIG. 14 illustrates a cross-sectional view of an exemplary integrated circuit package with an isolated heat spreading layer;

FIG. 15 illustrates a cross-sectional view of an exemplary integrated circuit package with a chip having through silicon vias;

FIGS. 16 and 17 illustrate cross-sectional views of exemplary integrated circuit packages with a backside of nano metal or solder on plated, sputtered, or structured metal, and an optional isolated heat sink and/or metal foil layer thereon.

DETAILED DESCRIPTION

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-3 show an exemplary process flow, from a cross-sectional view, for fabricating an exemplary package module 10. The exemplary process flow, or method, for integrated circuit packaging may be implemented as follows.

In FIG. 1, package module 2 may begin to be formed from successive build-up layers (a laminate) which define a top side 3, a bottom side 1 and circuit interconnections 4. Such circuit interconnections 4 may be vias formed in the manner described below with regard to vias 5 and/or include, for example, embedded passive components such as circuit wiring, capacitors, resistors, and/or inductors. For example, it may include layered routing 8, formed, for example of structured metal. Circuit interconnections 4 may be made using standard high density interconnections technology, and may have bottom side pads 6 electrically coupled thereto provided on bottom side 1 of package module 2. Further, in addition to traditional layering techniques, the build-up layering process may also include depositing thin film on an ultra-thinned core.

Vias 5 may also be formed in package module 2 by, for example, mechanical numerical control (NC) drilling, laser drilling, formations of successive build-up layers, or by other means known in the art. After via holes are formed, vias 5 may be metalized by electroless plating or electrolytic plating, for example.

Solder balls 12 may be provided in electrical connection with vias 5 and/or circuit interconnections 4 providing a contact terminus on bottom side 1 of package module 2 of integrated circuit package 10 for connection, such as to a printed circuit (PC) board.

In FIG. 2, further successive build-up layers are added to the formation of package module 2. This process results in embedding passive components into package module 2. In this manner all layers of the package may contain structured metal for routing of, for example, signals, power, and ground.

In FIG. 3 a cavity 14 is formed on a top side 3 of package module 2. Laser drilling, amongst other techniques, may be used to form cavity 14. Once cavity 14 is formed, connection pads, if not already present, may be added by conventional methods to circuit interconnections 4 exposed in cavity 14. As discussed below with reference to FIG. 4, cavity 14 should preferably be formed such that a chip 16 is capable of being disposed in cavity 14.

FIG. 4 illustrates a cross-sectional view of an exemplary integrated circuit package 40 with chip 16 having a back-side contact. Such chips include, for example, IGBTs, through which current flows vertically (i.e. from back to front through the silicon substrate) from the back-side contact of the chip to its front side. Chip 16, having a set of forward contacts 7, and depending upon the type of chip, having back-side contact 20 on back side 18 is disposed into cavity 14 such that forward contacts 7 are electrically connected to one or more of circuit interconnections 4 of package module 2. Forward contacts 7 of chip 16 may be formed during the chip's normal fabrication process, and may be electrically connected through circuit interconnections 4 to bottom side 1 of package module 2. Gaps between chip 16 and package module 2, if present, may be filled such as with a fill material 22. Fill material 22 may also be used as an underfill material (not shown), thereby embedding a chip.

Other configurations may include chip 16 being a high-performance logic chip. Such a high-performance logic chip may include, for example, an Intel® Core™, an AMD® Phenom II™, or an IBM® Z196™. Another configuration may include chip 16 being a thinned chip.

FIG. 5 illustrates a cross-sectional view of an exemplary integrated circuit package 50 with a top layer. A top layer 24 is provided, such as by plating (as, for example, after surface treatment of the laminate material forming package module 2) onto at least a portion of top side 3 of package module 2 as discussed above with respect to integrated circuit package 10 (FIGS. 1-3), and at least a portion of back side 18 of chip 16. Alternatively, top layer can be sputtered metal, plated following sputtering, a metallic layer formed by application of dirty plasma, or ink jetted over some or all of the chip and/or top side 3 of package module 2. Typically, top layer 24 may be coupled to back-side 18 of chip 16 and covers at least a part of chip 16 and the top-side of package module 2. Advantageously, top layer 24 may be a metallic layer such as copper for instance or a structured metal. Depending on the application and type of chip used, the coupling between chip 16 and top layer 24 may establish a thermal and/or electrical connection with back side 18 of chip 16.

In an implementation wherein top layer 24 establishes an electrical connection with back side 18 of chip 16, top layer 24 may advantageously be positioned in electrical contact with one or more vias 5, thereby establishing an electrical connection from back side 18 of chip 16 to bottom side 1 of package module 2. In particular, for chips having a back-side contact 20, electrical connection between contact 20 and bottom side 1 is thus established.

In use, integrated circuit package 50 may be connected to outside circuitry such as through a PC board (not shown). Electrical current provided to chip 16 through the electrical connections established at bottom side 1 of package module 2 flows to forward contacts of chip 16 through circuit interconnections 4 and to back-side contact 20 through vias 5. For example, chip 16 may be a so-called "power chip", or a power electronics chip having a low-ohmic back-side contact. Such chips may operate with current flowing vertically through the chip, such as between back sides 18 toward forward contacts 7. In such a case, back-side contact 20 is typically a low-ohmic contact, which may be formed on chip 16 during or after fabrication of chip 16. In such a case, electrical contact between low ohmic back-side contact 20 and vias 5 allow the basic integrated circuit package 10 described above in FIGS. 1-3 to function with power chips having low-ohmic back-side contacts through the addition of an electrically conductive top layer 24 when used in the configuration of circuit package 50 of FIG. 5.

In addition to the provision of access to a back-side electrical connection in integrated circuit package 50, use of power chips in high-performance applications may also generate additional heat when compared with chips having lower current handling capability or current requirements. Careful selection of material used in top layer 24 may help, owing to the characteristics of the material selected to diffuse heat in addition to its ability to conduct electrical current. Therefore, materials such as copper, copper alloys, silver, nickel, and similar materials with a high thermal and/or electrical conductivity are particularly suitable for use as top layer 24. When used for heat spreading in this manner, good thermal coupling between chip 16 and top layer 24 is desirable. Further heat dissipating efficiency can be obtained by maximizing the surface area of top layer 24, and the percentage of that area exposed to ambient air for example, and/or by increasing the thickness of top layer 24 to increase thermal mass and/or ensure efficient spreading of heat throughout top layer 24 by conduction.

Where heat generated during operation of chip 16 is not adequately dissipated by integrated circuit package 50, additional thermal structures may be added without affecting the ability of top layer 24 to function as an electrical connection to a back-side contact, such as back-side contact 20 of chip 16. Accordingly, and as described below with reference, for example, to FIG. 6, top layer 24 may be configured to act as both an electrical connector and as a thermal heat spreader, resulting in circuit package 60, having superior thermal characteristics in addition to the electrical features of integrated circuit package 50.

Although some chips such as high performance logic chips may not have a low ohmic back-side contact 20, such high performance logic chips may, like power chips, generate high temperatures beyond those readily dissipated by the chip or by its packaging. In such a case, top layer 24 can be selected from materials such as copper that provide good heat spreading characteristics. Thus, top layer 24 may be made of any material that furthers the above described functionality, in particular materials that have high electrical and/or thermal conductive properties, as the particular chip 16 may require. Therefore, whether or not electrical contact to the back side of a chip is needed, the present package configuration provides a structure and method consistent with a chip-last approach to packaging that can accommodate chips having a wide range of design requirements.

If top layer 24 is composed of metal it may be implemented, for example, with any suitable type of plated metal, sputtered metal, structured metal, metal foil or combination thereof and moreover may be attached, for example, by gluing or soldering top layer 24 to chip 16, such as in the case of metal foil, and to the top-side of package module 2, such as by an adhesive. Other methods of application may also be used, such as in a nano paste, through deposition with dirty plasma, or by sputtering or solder. Depending on the configuration, one or more of the above can be used in combination, for example taking into consideration the affinity of materials to each other.

Dirty plasma is known as a plasma with supporting gas which has particle-sized metal powder suspended therein. This method is particularly advantageous in forming a layer having sufficient material thickness and minimal additional processing to obtain top layer 24 after chip 16 has been placed within package module 2.

If top layer 24 is glued, it might be desirable that the glue possess high electrical and/or thermal conductive properties in order to facilitate the advantages of electrical and/or thermal connectivity with top layer 24 as heretofore described. Examples of such glue include, for example, Tanaka® TS-333™ and Lord® MT-815™. By contrast, where insulation (either thermal and/or electrical) is desired, different material would be selected for this purpose.

In other configurations, in which top layer 24 may be attached with solder, soldering might include eutectic soldering. Another configuration might include nano metal as top layer 24. In such configurations, metal itself may naturally adhere as a part of its application as top layer 24 on back-side 18 of chip 16 and to the top-side of package module 2.

Vias 5 may terminate at solder balls 12 which in turn may be used to connect to outside circuitry such as, for example, a printed circuit board. This allows low ohmic back-side contact 20 to be connected to bottom side 1 of package module 2 and therefrom to circuitry outside package 40. Further vias 5 may be beneficial, for example, in logic chips that require a ground contact, or for radio frequency (RF) shielding purposes. Similarly, vias 5 may be beneficial, for example, in grounding power chips.

In order to balance the electrical load in, for example, high performance chips, multiple vias 5 may be connected to top layer 24 to split the current across multiple vias 5. In another application, vias 5, when connected to low ohmic back-side contact 34 as described, may act as part of a feedback loop.

As noted above, top layer 24 may function as a heat spreader instead of, or in addition to being part of the electrical connection between back-side contact 20 and bottom side 1 of package module 2. As the surface area of top layer 24 typically exceeds the area of back-side 18 of chip 16, a significant increase in heat dissipation from chip 16 will occur through heat spreading in top layer 24 depending on the material used and configuration (such as thickness) thereof. However, where additional heat dissipation is required additional thermal structures can be provided.

FIG. 6 illustrates a cross-sectional view of an exemplary integrated circuit package 60 with a heat sink and/or metal foil layer 26. As illustrated, top layer 24 may be directly attached to heat sink and/or metal foil layer 26 providing thermal contact therewith. Heat sink and/or metal foil layer 26 may be attached, for example, mechanically or adhered to top layer 24 with nano paste, glue, dirty plasma (such as in combination with plating and solder), or solder (such as after sputter and plating of 5 µm of copper), thermal compound or eutectic soldering.

In the instance where 26 functions as a heat sink, it may be designed, for example, with straight fins or pin fins and be constructed of copper or aluminum or other materials with high thermal conductivity to increase its efficiency. Moreover, such a heat sink is preferably well ventilated by ambient air. Aided by the heat spreading properties of top layer 24, such as when top layer 24 is formed of copper, the efficiency of the heat sink is improved.

In the instance where 26 is a metal foil layer, it may be coupled onto top layer 60, and constructed of, for example, copper. Metal foil layer 26 may serve the same purpose as a heat sink, namely, metal foil layer 26 may serve as a means for dissipating heat and/or may also help with high current loads, such as where layers 24 and 26 function together to provide electrical contact to back-side contact 20 of chip 16.

Other heat sink methods may also be used for heat sink and/or metal foil layer 26. For example, an active fan may blow cool external air across a set of heat sink fins. In another example, the heat sink may be liquid cooled with an apparatus circulating liquid.

FIGS. 7-9 illustrate cross-sectional views of exemplary integrated circuit packages (70, 80, and 90 respectively) as in FIGS. 4-6 with a top side package contact 28. In this alternative approach top side 3 has a contact applied thereto thus forming a top side package contact 28. Similar to FIGS. 5 and 6, a top layer 24 may be attached directly to top side package contact 28 and back-side contact 20. Further, alternatively or in addition to, a heat sink and/or a metal foil layer 26 may be attached to the integrated circuit package.

FIG. 10-12 illustrate cross-sectional views of exemplary integrated circuit packages (100, 110, and 120 respectively) as in FIGS. 4-6 with top side pads 30 and/or isolating middle layers 32. Top side pads 30 may be formed on top side 3 of package module 2. Top layer 24 may be coupled to back-side 18 of chip 16 and top-side of package module 2 by way of isolating middle layer 32. Isolating middle layer may insulate, for example, a subset of vias 5, from direct electrical contact with top layer 24. Such an arrangement may be useful, for example, in chip stacking arrangements, or where insulated vias 35 are already connected (such as by various configurations of layered routing as disclosed above in connection with FIGS. 1-3) to another device or are to be reserved to establish other connections not related to top layer 24. Moreover, there may be metal patterning thereon, including, for example on a portion of top layer 24, isolating middle layer 32, connection pads of circuit interconnections 4, forward contacts 7, vias 5, and/or isolated vias 35. Such metal patterning may, for example, be employed for electrical routing therebetween.

FIG. 13 illustrates a cross-sectional view of an exemplary integrated circuit package 130 with multiple chips 36, 34. Combinations of the above embodiments may also be formed. For example, power chip 36 may be packaged, according to the chip-last approach as described herein, alongside logic chip 34 with the same chip-last technique. That is, two or more cavities may be formed within package module 2. Similarly, two or more chips as described above may be disposed within the cavities and physically, electrically, and/or thermally connected as heretofore described. In a logic chip plus power chip configuration, a portion of top layer 24 may be used, for example, for electrical routing between logic chip 34 and low power chip 36. Alternatively, electrical routing may take place within package module 2. As a further alternative, integrated circuit package 130 may include isolating middle layer 32 which may isolate chip 34 from physical, electrical, and/or thermal contact with top layer 24.

FIG. 14 illustrates a cross-sectional view of an exemplary integrated circuit package 140 with an isolated heat spreading layer 38. Isolated heat spreading layer 38 is electrically isolating and thermally conductive. AlN filled glues may be applied, for example, to achieve the electrically isolating yet thermally conductive functionality. Such a configuration may be advantageous where it is desirable to electrically isolate portions of top layer 24 from upper layers such as, for example, heat sink and/or metal foil layer 26.

FIG. 15 illustrates a cross-sectional view of an exemplary integrated circuit package 150 with a chip having through silicon vias (TSVs) 37. TSVs 37 vertically pass through chip 16 and thus provide electrical connection on back-side. TSVs may help to increase performance by facilitating a higher three-dimensional density, and/or lowering contact resistance to back-side 18. TSVs 37 may optionally be directly coupled to forward contacts 7 of chip 16, or to the internal circuitry of chip 16 (not shown). TSVs may also be used in multiple chip configurations such as exemplary integrated circuit package 130 described above with reference to FIG. 13.

FIGS. 16 and 17 illustrate cross-sectional views of exemplary integrated circuit packages (160 and 170 respectively) with a backside of nano metal or solder on plated, sputtered, or structured metal, and an optional isolated heat sink and/or metal foil layer 26 thereon. In particular, FIGS. 16 and 17 depict structured recesses 39 structured in top layer 24, top side package contact 28, and heat sink and/or metal foil layer 26. Structured recesses 39 are functional for example, as part of the electrical routing on top side 18 of package module 2. Such routing, for example, could be used to electrically connect stacked chip 41. Some methods of applying printed metal structures include, for example, ink jetting, or so called screen or stencil printing. While both of the methods may be used to apply structured metal, screen printing is generally less expensive while ink jetting results in a thinner and finer pitched application.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An integrated circuit package comprising:
   a package module formed from successive build-up layers which define circuit interconnections, the successive build-up layers comprising a laminate;
   a cavity formed within the package module at a top-side of the package module;
   a chip having a front side with at least one forward contact and having a back-side, the chip disposed in the cavity such that at least one forward contact is electrically connected to at least one of the circuit interconnections of the package module;
   a top layer coupled to the back-side of the chip, the top layer electrically connected to a bottom side of the package module through one or more integral vias, each of the integral vias substantially vertically extending from the top-side of the package module through to the bottom side of the package module, the top layer covering at least a part of the chip and the top-side of the package module; and
   a metal foil layer coupled onto the top layer by an adhesive.

2. The integrated circuit package recited in claim 1 wherein the back-side of the chip has a low ohmic contact.

3. The integrated circuit package recited in claim 2 wherein current flows vertically between the low ohmic contact and the at least one forward contact of the chip.

4. The integrated circuit package recited in claim 2 wherein the top layer is a metallic layer.

5. The integrated circuit package recited in claim 4 wherein the low ohmic contact is electrically connected to the top layer, and therethrough to one or more vias formed in the package module.

6. The integrated circuit package recited in claim 1 wherein the top layer has thermally conductive properties facilitating heat spreading.

7. The integrated circuit package recited in claim 6 wherein the top layer is attached to a heat sink.

8. The integrated circuit package recited in claim 1 wherein the top layer is formed by dirty plasma.

9. The integrated circuit package recited in claim 1 wherein the top layer is selected from the group consisting of plated metal, sputtered metal, structured metal, and nano metal.

10. The integrated circuit package recited in claim 9 wherein the top layer is coupled to the back-side of the chip and the top-side of the package module by an adhesive.

11. The integrated circuit package recited in claim 1 wherein the chip further comprises through silicon vias.

12. The integrated circuit package recited in claim 1 wherein the top layer is coupled to the back-side of the chip or the top-side of the package module by way of an isolating middle layer.

13. An integrated circuit packaging method comprising:
    fabricating a package module from successive build-up layers which define circuit interconnections;
    forming a cavity within the package module at a top-side of the package module;
    disposing a chip, the chip having a front side with at least one forward contact and having a back-side, in the cavity such that at least one forward contact is electrically connected to at least one of the circuit interconnections of the package module;

coupling a top layer to the back-side of the chip covering at least part of the chip and the top-side of the package module, wherein the top layer is in electrical connection with a bottom side of the package module through one or more integral vias, each of the integral vias extending substantially vertically from the top-side of the package module through to the bottom side of the package module; and a metal foil layer coupled onto the top layer by an adhesive.

14. The integrated circuit packaging method recited in claim 13 wherein the back-side of the chip has a low ohmic contact.

15. The integrated circuit packaging method recited in claim 14 wherein current flows vertically between the low ohmic contact and the at least one forward contact of the chip.

16. The integrated circuit packaging method in claim 14 wherein the top layer is a metallic layer.

17. The integrated circuit packaging method recited in claim 16 wherein the low ohmic contact is electrically connected to the top layer, and therethrough to one or more vias formed in the package module.

18. The integrated circuit packaging method recited in claim 13 wherein the top layer has thermally conductive properties.

19. The integrated circuit packaging method recited in claim 18 further comprising attaching the top layer to a heat sink.

20. The integrated circuit packaging method recited in claim 13 wherein the top layer is formed by dirty plasma.

21. The integrated circuit packaging method recited in claim 13 wherein the top layer is selected from the group consisting of plated metal, sputtered metal, structured metal, and nano metal.

22. The integrated circuit packaging method recited in claim 21 wherein the top layer is coupled to the back-side of the chip or the top-side of the package module by an adhesive.

23. The integrated circuit packaging method recited in claim 13 wherein the chip further comprises through silicon vias.

24. The integrated circuit packaging method recited in claim 13 wherein the top layer is coupled to the back-side of the chip or the top-side of the package module by way of an isolating middle layer.

* * * * *